(12) United States Patent
He et al.

(10) Patent No.: US 11,495,283 B2
(45) Date of Patent: Nov. 8, 2022

(54) INTEGRATED ASSEMBLY WITH MEMORY ARRAY OVER BASE, SENSE AMPLIFIERS IN BASE, AND VERTICALLY-EXTENDING DIGIT LINES ASSOCIATED WITH THE MEMORY ARRAY

(71) Applicant: Micron Technology, Inc., Boise, ID (US)

(72) Inventors: Yuan He, Boise, ID (US); Beau D. Barry, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/146,223

(22) Filed: Jan. 11, 2021

(65) Prior Publication Data

US 2022/0223196 A1 Jul. 14, 2022

(51) Int. Cl.
*G11C 7/22* (2006.01)
*G11C 11/4091* (2006.01)
*G11C 11/4074* (2006.01)

(52) U.S. Cl.
CPC ...... *G11C 11/4091* (2013.01); *G11C 11/4074* (2013.01)

(58) Field of Classification Search
CPC .................. G11C 11/4091; G11C 11/4074
See application file for complete search history.

(56) References Cited

U.S. PATENT DOCUMENTS

| | | | |
|---|---|---|---|
| 11,069,385 B1* | 7/2021 | Li | G11C 11/404 |
| 11,152,056 B1* | 10/2021 | Seo | H01L 27/10808 |
| 2020/0051613 A1* | 2/2020 | Derner | G11C 5/025 |
| 2020/0185370 A1* | 6/2020 | Juengling | H01L 23/5226 |

OTHER PUBLICATIONS

U.S. Appl. No. 17/079,745, filed Oct. 26, 2020, Lee et al.

* cited by examiner

*Primary Examiner* — Mushfique Siddique
(74) *Attorney, Agent, or Firm* — Wells St. John P.S.

(57) ABSTRACT

Some embodiments include an integrated assembly having a memory array over a base. First sense-amplifier-circuitry is associated with the base and includes sense amplifiers directly under the memory array. Vertically-extending digit lines are associated with the memory array and are coupled with the first sense-amplifier-circuitry. Second sense-amplifier-circuitry is associated with the base and is offset from the first sense-amplifier-circuitry. Control circuitry is configured to selectively couple the digit lines to either a voltage supply terminal or to the second sense-amplifier-circuitry.

18 Claims, 7 Drawing Sheets

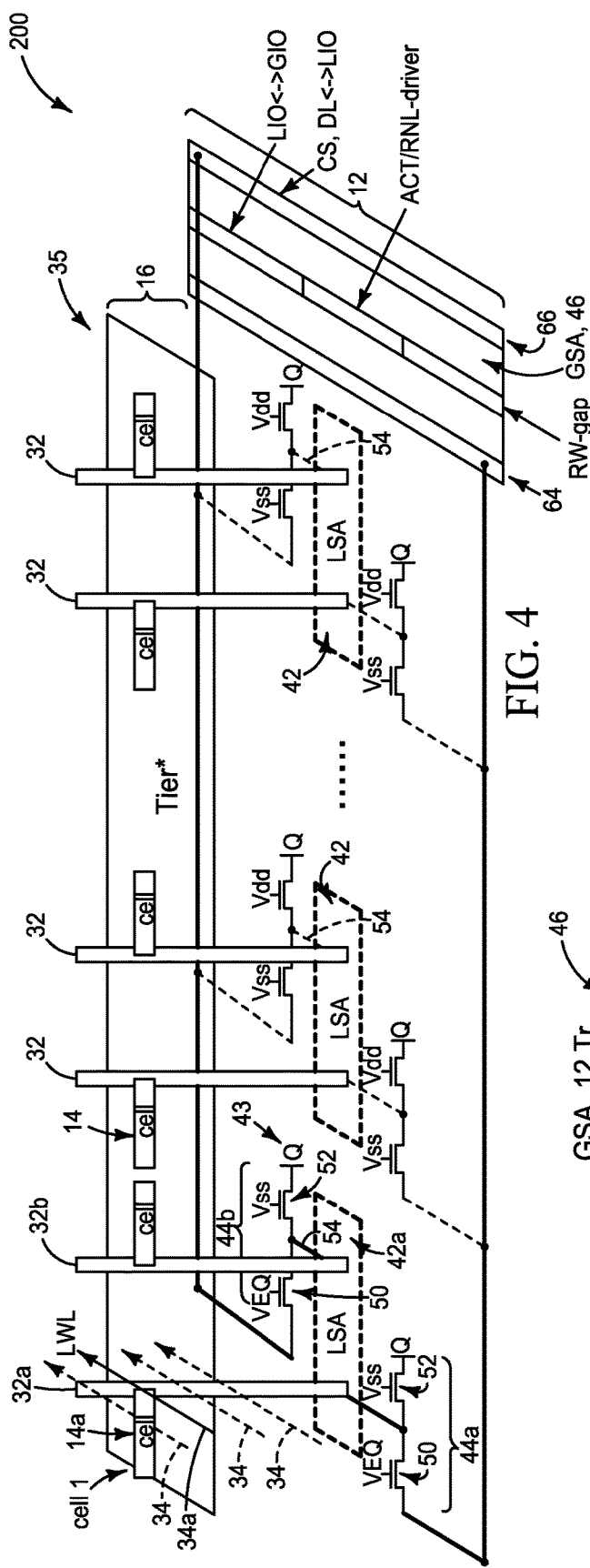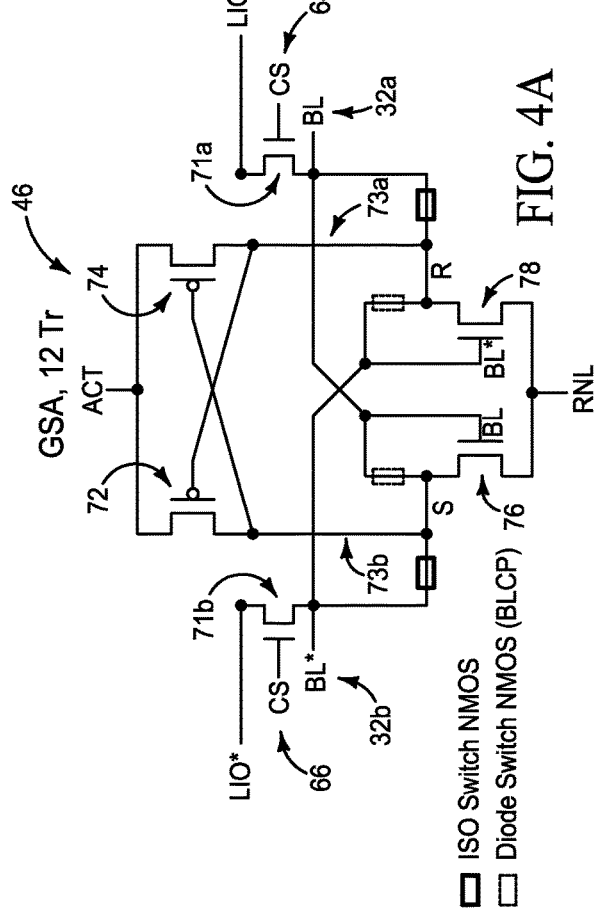
FIG. 4
FIG. 4A-1
FIG. 4A

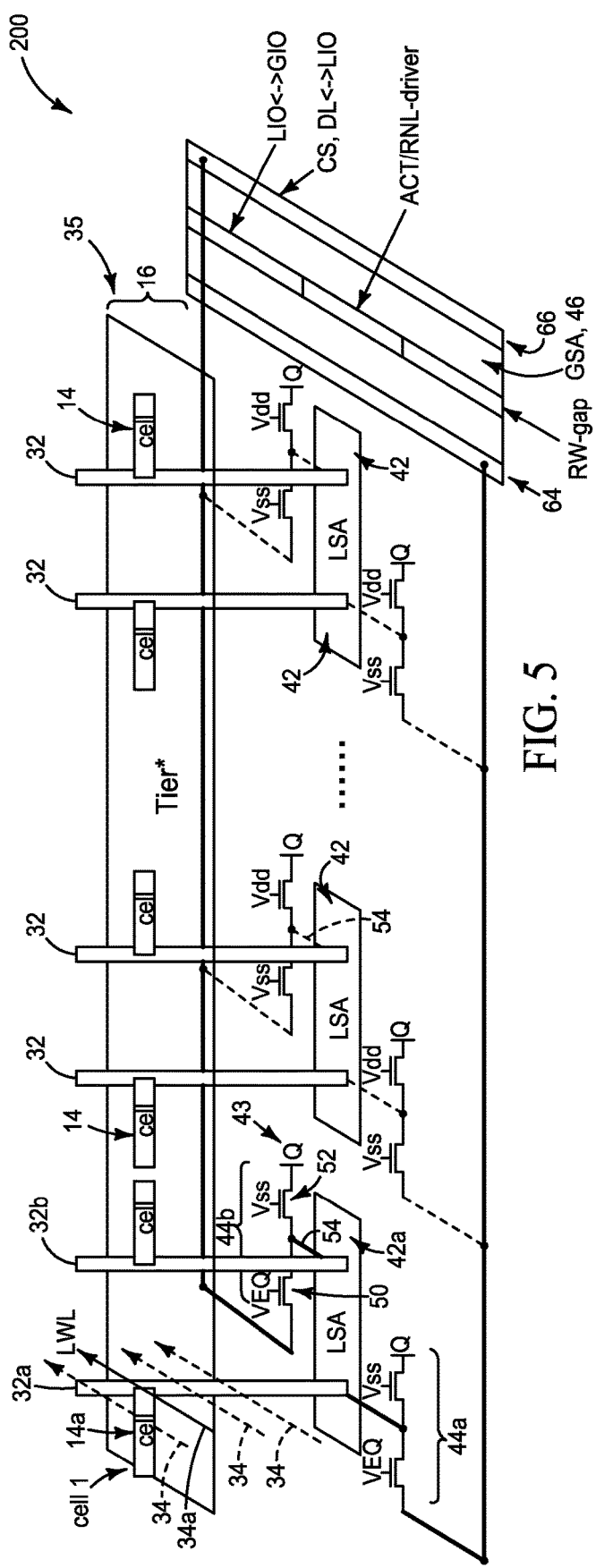
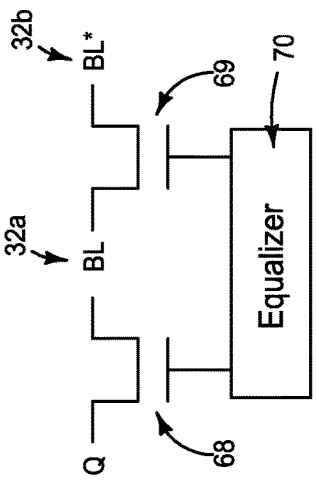
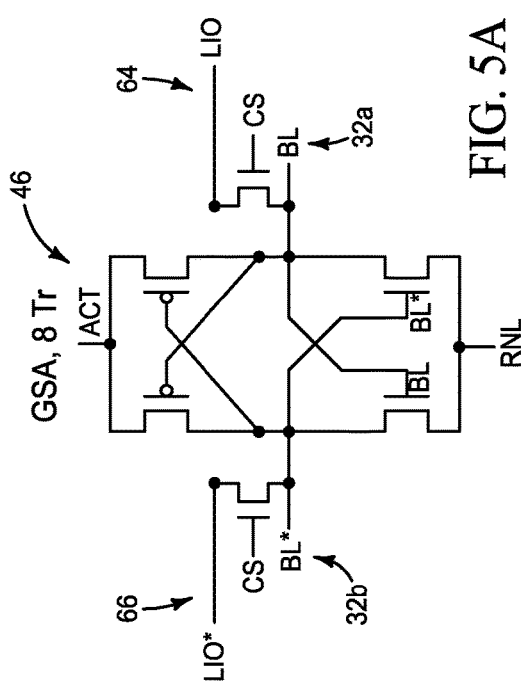
FIG. 5
FIG. 5A-1
FIG. 5A

INTEGRATED ASSEMBLY WITH MEMORY ARRAY OVER BASE, SENSE AMPLIFIERS IN BASE, AND VERTICALLY-EXTENDING DIGIT LINES ASSOCIATED WITH THE MEMORY ARRAY

TECHNICAL FIELD

Integrated memory (e.g., DRAM).

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which have one capacitor in combination with one transistor (so-called 1T-1C memory cells), with the capacitor being coupled with a source/drain region of the transistor A region of an example prior art DRAM configuration 10 is shown in FIG. 1. The configuration 10 includes memory cells 14 (only some of which are labeled) arranged in a three-dimensional memory array 16. An x, y, z coordinate system is provided adjacent to the region of the assembly 10 to assist in describing relative directions of various structures.

Each of the memory cells comprises an access device 18 (only one of which is labeled) coupled with a capacitor 20 (only one of which is labeled).

The access devices 18 correspond to horizontally-extending transistors, with each of the transistors comprising a channel region 22 between a pair of source/drain regions 24 and 26.

The channel regions and source/drain regions may be formed within semiconductor material 28. The semiconductor material 28 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15).

The source/drain regions 24 and 26 may correspond to heavily-doped regions formed within the semiconductor material 28.

In the illustrated embodiment, the semiconductor material 28 extends to a conductive plate 30. The conductive plate 30 may be utilized to drain excess carriers (e.g., holes) from body regions (channel regions) of the transistors 18 in some operational states.

Vertically-extending digit lines (bitlines, sense lines) 32 are along columns of the memory array 16, and are coupled with the source/drain regions 24.

Horizontally-extending wordlines (access lines) 34 extend along rows of the memory array 16 and are operatively proximate to the channel regions 22.

The wordlines 34 extend along an illustrated y-axis direction, and the digit lines 32 extend along an illustrated z-axis direction. The vertically-extending digit lines 32 may be orthogonal to the wordlines 34, or at least substantially orthogonal to such wordlines (with the term "substantially orthogonal" meaning orthogonal to within reasonable tolerances of fabrication and measurement). In some embodiments, the digit lines 32 may extend along a direction which is within about 10° of being orthogonal to the wordlines 34.

The wordlines 34 may be considered to comprise gating regions operatively adjacent to the channel regions 22 of the transistors 18 so that the source/drain regions 24 and 26 of the individual transistors 18 are gatedly coupled to one another. When the term "gated coupling" is utilized herein, such may refer to the controlled coupling/decoupling of the source/drain regions 24 and 26 from one another that may be induced by electrical activation/deactivation the wordlines 34.

The gating regions along the wordlines 34 are spaced from the channel regions 22 by gate dielectric material 36. The gate dielectric material may comprise any suitable composition(s), and in some embodiments may comprise, consist essentially of, or consist of silicon dioxide.

The wordlines 34 may extend to wordline-driver-circuitry (e.g., sub-wordline-driver units (SWD units)) outside of the illustrated region of the assembly 10. Staircase regions may be laterally adjacent to the memory array 16, and may be utilized for coupling individual wordlines with specific SWD units.

The memory cells 14 may be considered to be arranged within vertically-stacked tiers (levels) 35.

Conductive nodes 38 (only a couple of which are labeled) are adjacent to the source/drain regions 26, and couple such source/drain regions with the storage elements 20. In some embodiments, the conductive nodes 38 may be considered to be part of the storage elements 20.

In operation, the wordlines 34 may be utilized for selectively coupling a capacitor 20 with a digit line 32 during a READ/WRITE operation associated with a memory cell 14. Each of the memory cells 14 may be considered to be uniquely addressed utilizing one of the digit lines 32 in combination with one of the wordlines 34.

The digit lines may be coupled with sensing circuitry (e.g., sense-amplifier-circuitry). The sensing circuitry may be utilized for ascertaining the memory states of memory cells during READ operations, and may be utilized for assisting in the programming of memory cells during WRITE operations.

It is desired to develop sensing circuitry which may be highly-integrated together with the memory array 16 in an integrated assembly.

BRIEF DESCRIPTION OF THE DRAWINGS

FIG. 3B-1 is a diagrammatic schematic view of an example control circuit which may be utilized with the Mux configuration of FIG. 3B.

FIG. 4 is a diagrammatic view of an example arrangement of memory, sense-amplifier-circuitry and control circuitry at an example operational stage.

FIG. 4A is a diagrammatic schematic view of an example layout of an example sense amplifier configuration.

FIG. 4A-1 is a diagrammatic schematic view of a region of an example equilibration circuit which may be utilized with the sense amplifier configuration of FIG. 4A.

FIG. 5 is a diagrammatic view of an example arrangement of memory, sense-amplifier-circuitry and control circuitry at an example operational stage.

FIG. 5A is a diagrammatic schematic view of an example layout of an example sense amplifier configuration.

FIG. 5A-1 is a diagrammatic schematic view of a region of an example equilibration circuit which may be utilized with the sense amplifier configuration of FIG. 5A.

DETAILED DESCRIPTION OF THE ILLUSTRATED EMBODIMENTS

Some embodiments include integrated assemblies having at least two different types of sense-amplifier-circuitries. The two different types may include first sense-amplifier-circuitry and second sense-amplifier-circuitry. The first sense-amplifier-circuitry (which may also be referred to as local sense-amplifier-circuitry) includes sense amplifiers directly under vertically-extending digit lines, and is utilized for PRECHARGE operations, and possibly also for providing signal boosting during READ/WRITE operations. The second sense-amplifier-circuitry (which may also be referred to as global sense-amplifier-circuitry) is utilized for the READ/WRITE operations. Example embodiments are described with reference to FIGS. 2-6.

FIGS. 3-6 describe specific example operations that may be utilized relative to configurations having local sense-amplifier-circuitry and global sense-amplifier-circuitry. Before describing the specific operations, FIG. 2 will be used to generally describe an example orientation of the local sense-amplifier-circuitry and global sense-amplifier-circuitry relative to an example memory array.

Figure 1:
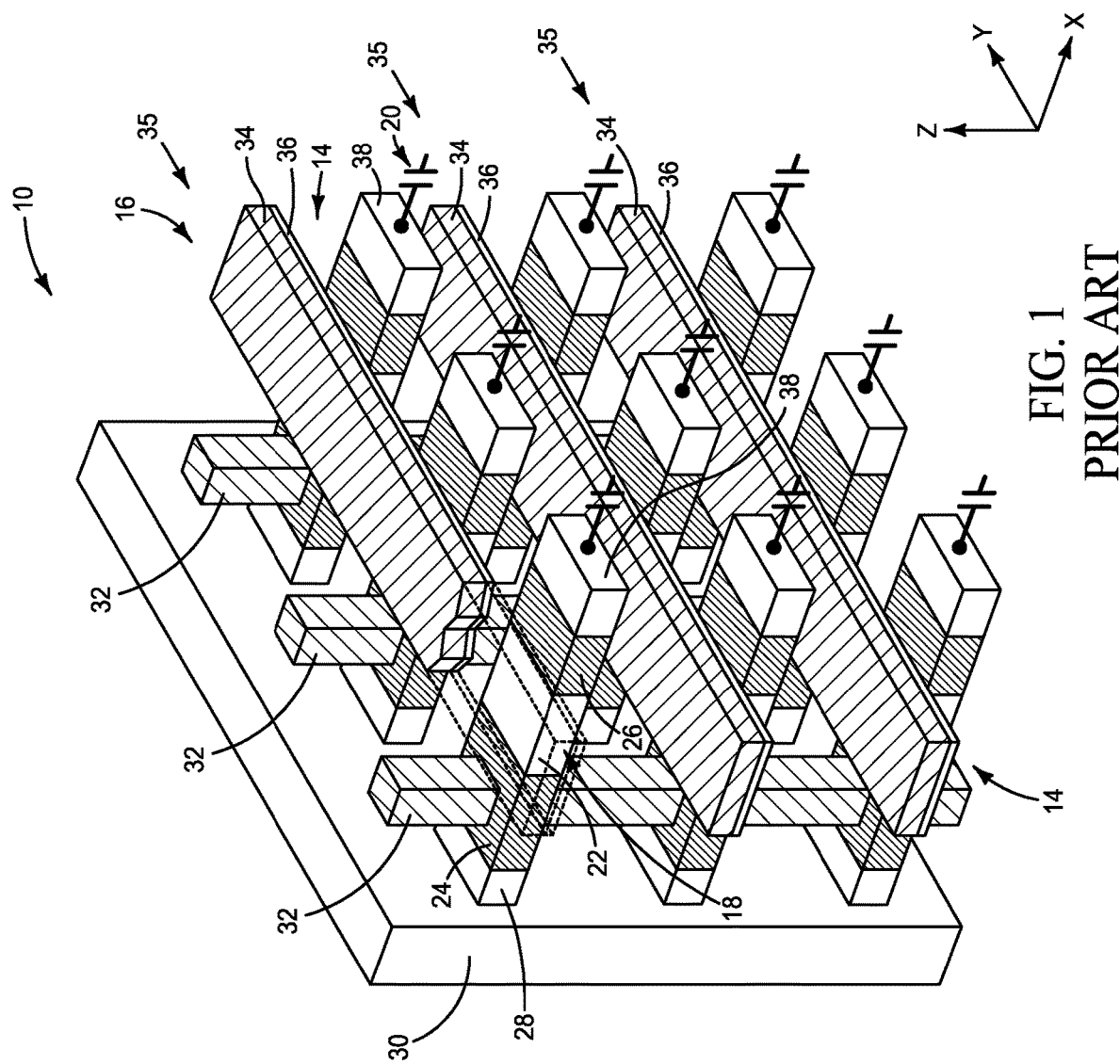
FIG. 1 is a diagrammatic three-dimensional view of a region of a prior art integrated assembly having a memory array which extends across multiple vertically-displaced tiers.
Figure 2:
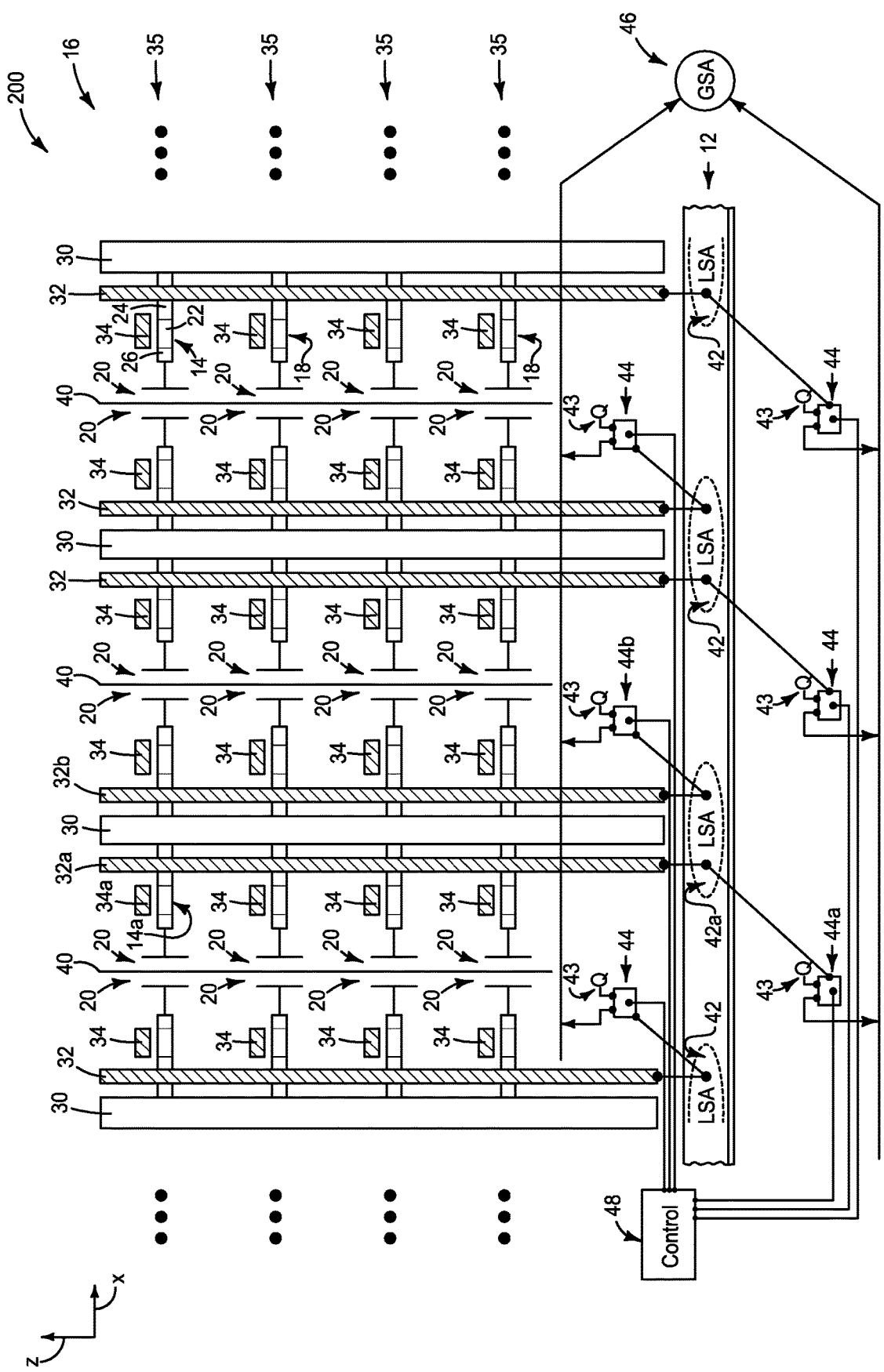
FIG. 2 is a diagrammatic cross-sectional side view of a region of an integrated assembly comprising an example arrangement of memory cells, digit lines and sense-amplifier-circuitries.

FIG. 2 shows a region of an integrated assembly 200 which comprises a memory array 16 analogous to that described above with reference to FIG. 1. The memory array includes a plurality of vertically-extending digit lines 32, and a plurality of horizontally-extending wordlines 34. The wordlines 34 extend in and out of the page relative to the cross-sectional view of FIG. 2. Insulative materials are not specifically illustrated in FIG. 2, but rather locations of the insulative materials are diagrammatically indicated with spaces. Accordingly, the gate dielectric material 36 of FIG. 1 is diagrammatically indicated in FIG. 2 by spaces between the wordlines 34 and the underlying memory cells 14.

The memory cells 14 (only one of which is labeled) extend horizontally along an illustrated x-axis, with the memory cells comprising access devices 18 (only some of which are labeled) and capacitors 20. In the shown embodiment, laterally-adjacent capacitors share a plate electrode 40.

The memory array 16 may be considered to comprise a three-dimensional arrangement of the memory cells 14, with such arrangement having rows extending in and out of the page relative to the cross-section of FIG. 2 (i.e., extending along the illustrated y-axis of FIG. 1), and having columns extending along the illustrated z-axis. Accordingly, the wordlines 34 may be considered to be associated with the rows of the memory array, and the digit lines (bitlines) 32 may be considered to be associated with the columns of the memory array.

The illustrated region of the memory array 16 comprises four of the vertically-stacked tiers 35 of the memory cells 14. It is to be understood that the memory array 16 may comprise any suitable number of the tiers 35. In some embodiments, the memory array 16 may comprise 4 of the vertically-stacked tiers (as shown), 8 of the vertically-stacked tiers, 16 of the vertically-stacked tiers, 32 of the vertically-stacked tiers, 64 of the vertically-stacked tiers, etc.

The memory array 16 may be considered to be supported by an underlying base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

First sense-amplifier-circuitry 42 is associated with the base 12, and is subdivided into a plurality of local sense amplifiers (LSAs). Lateral boundaries of the individual LSAs are diagrammatically illustrated with dashed lines. The boundaries are shown to be elliptical, but may comprise any suitable shapes, including, for example, polygonal shapes, circular shapes, etc. The individual LSAs may comprise any suitable dimensions.

Each LSA comprises NMOS and PMOS transistors, as described in more detail below relative to FIG. 3A. The NMOS and PMOS transistors may be within CMOS supported by the base 12. Such CMOS may include regions which extend into the base 12 and/or may include regions over the base 12.

The LSA regions 42 are directly under the memory array 16, and in the shown embodiment each LSA region is directly under a pair of the digit lines 32. For instance one of the LSA regions is labeled 42a, and is shown to be directly under a pair of digit lines labeled 32a and 32b. The digit lines 32a and 32b are shown to be electrically coupled with the LSA region 42a. One of the digit lines 32a and 32b may be a "true" digit line (BL) and the other may be a complementary digit line (BL*). The true and complementary digit lines 32a and 32b may be coupled to one another through the LSA region 42a during some operations (e.g., PRECHARGE operations, REFRESH operations, etc.).

In some operations, the complementary digit lines may be comparatively coupled to one another through sense-amplifier-circuitry. For purposes of understanding this disclosure and the claims that follow, a first digit-line is "comparatively coupled" with a second digit-line through sense-amplifier-circuitry if the sense-amplifier-circuitry is configured to compare electrical properties (e.g., voltage) of the first and second digit-lines with one another. It is noted that the terms "true" and "complementary" are arbitrary as utilized to label digit lines, and are simply used to differentiate the digit-lines which are compared to one another through sense-amplifier-circuitry.

The digit lines 32 are shown to be coupled with control circuitry 44. The control circuitry may be associated with the base 12. The control circuitry 44 is configured to electrically connect the digit lines with either a voltage supply terminal 43 (which provides voltage Q), or with a second sense-amplifier-circuitry 46. The second sense-amplifier-circuitry is shown to correspond to a global sense amplifier (GSA). The GSA unit (also referred to herein as a GSA region, or simply as a GSA) 46 may be in a location which is offset (e.g., laterally offset) relative to the LSA regions, and which is not directly under the memory array 16. An example GSA unit is described in more detail below with reference to FIG. 4.

Referring still to FIG. 2, the control circuitry 44 is coupled with a control unit 48 which is configured for controlling access of the digit lines to the voltage supply terminals 43 and the GSAs 46. The control unit 48 may be provided in any suitable location. For instance, the control unit 48 may be associated with the base 12, and may be laterally offset from the control circuitries 44 and the memory array 16.

In practice, the local sense amplifiers 42 may be relatively simple structures utilized for PRECHARGE operations, for REFRESH operations, and possibly also for providing signal boost during READ/WRITE operations. The global sense amplifier 46 may be a more complex structure utilized for READ/WRITE operations, and not for PRECHARGE operations and REFRESH operations.

An example PRECHARGE operation relative to the digit lines 32 may be described as follows. All of the wordlines 34 may be turned OFF, and the control unit 48 may be utilized to switch the control circuitry 44 to the voltage supply terminals 43. Such couples the digit lines 32 with the voltage Q of the voltage supply terminals, and thus charges the digit lines to the voltage Q. The voltage Q may be any suitable voltage, and in some embodiments may be about VCC/2.

An example REFRESH operation relative to the digit lines 32 may be described relative to the digit line 32a. After the PRECHARGE operation, the digit lines 32a and 32b will both be at the voltage Q. Subsequently, one of the wordlines 34 (for instance the wordline labeled 34a) may be activated, and such places the contents from the memory cell 14a onto the digit line 32a. The LSA 42a may then be utilized to comparatively couple the digit lines 32a and 32b, which results in the contents of the memory cell 14a being restored to a full charge/discharge level (i.e., a full rail level). Notably, the REFRESH operation may be conducted simultaneously within all of the digit lines associated with an activated wordline, and thus may simultaneously refresh an entire row of memory cells.

An example READ operation relative to the digit lines 32 may be described relative to the digit line 32a. After the PRECHARGE operation, the wordline 34a may be activated to transfer the contents from the cell 14a onto the digit line 32a, and the control unit 48 may be utilized to switch the control circuitries 44a and 44b so that the digit lines 32a and 32b are comparatively coupled to one another through the GSA 46 to ascertain the memory state of the cell 14a.

A WRITE operation is similar to the READ operation, except that data is transferred to the memory cell rather than being read from the memory cell.

Figure 6:
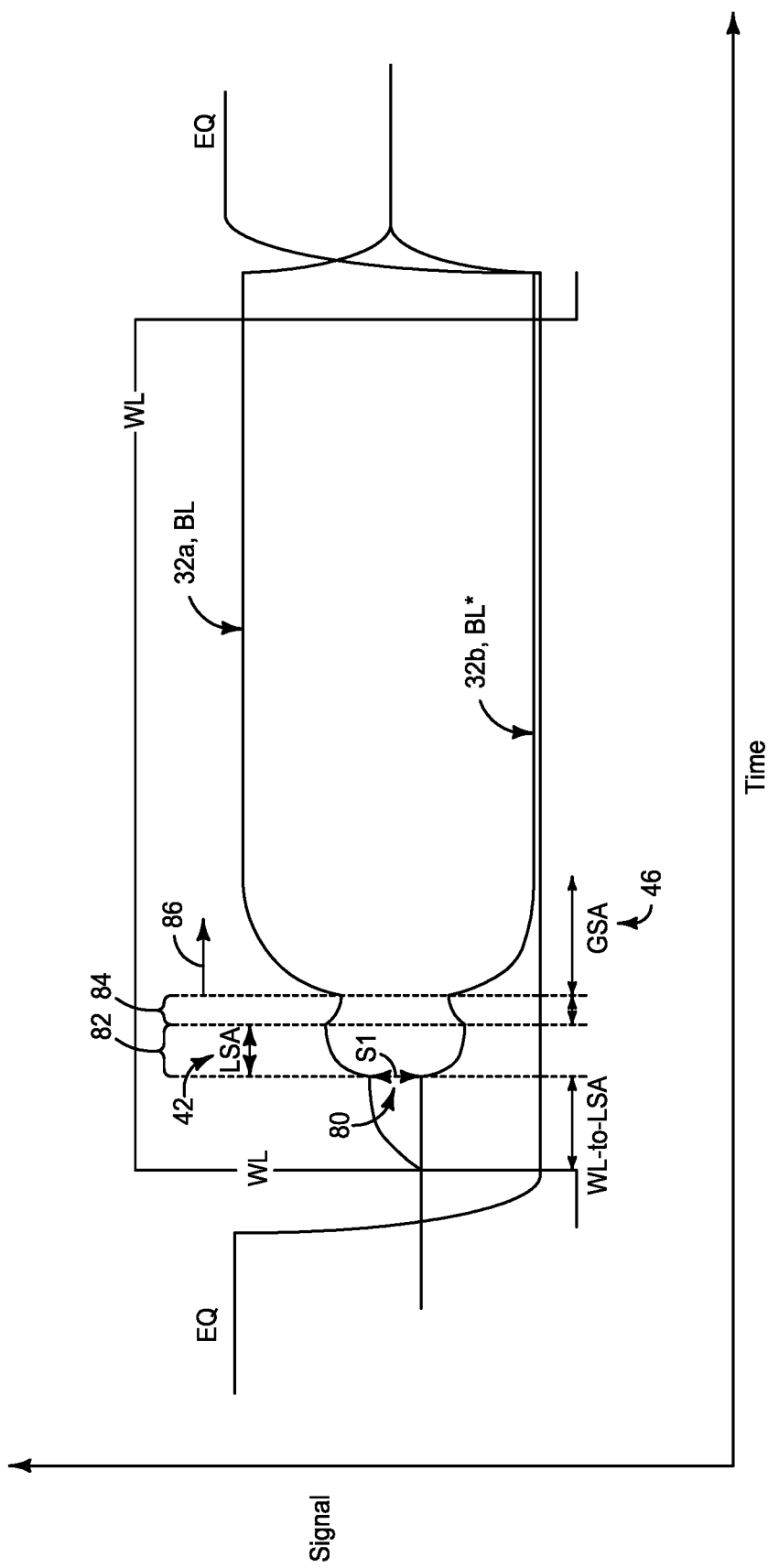
FIG. 6 is a graphical view of the timing and relative signal strength associated various structures of the memory arrangement of FIG. 5 during example operational stages.

The READ operation described above primarily utilized the GSA 46 to ascertain the contents of the memory cell 14a. In other embodiments, the LSA 42a may be initially used to perform an initial pre-sensing (a "soft" sensing) of the memory state of the cell 14a, and to boost the signal from the digit line 32a prior to utilization of the GSA 46. FIGS. 5 and 6 describe the utilization of the LSAs 42 in pre-sensing operations in more detail.

Figure 3:
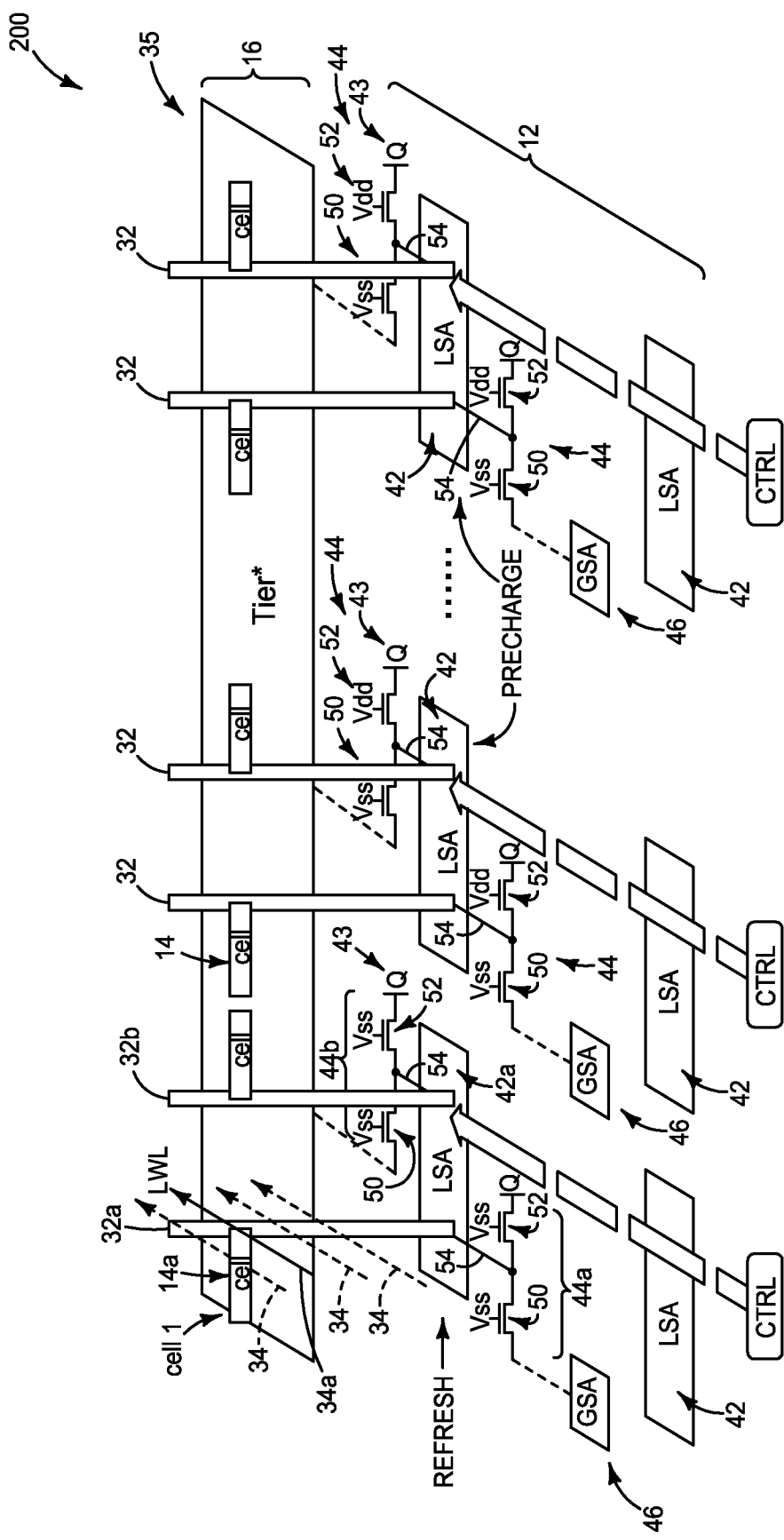
FIG. 3 is a diagrammatic view of an example arrangement of memory, sense-amplifier-circuitry and control circuitry at an example operational stage.

Referring to FIG. 3, such shows a region of the integrated assembly 200 utilized for example PRECHARGE/REFRESH operations. The assembly comprises the digit lines 32 associated with the LSA regions 42. An example memory tier 35 is illustrated as part of a memory array 16, and wordlines 34 are shown to extend along the tiers of the memory 16, with one of the wordlines (34a) being activated during the REFRESH operation, and being readily distinguishable from the other wordlines as it is a solid line labeled LWL. The wordline LWL and digit line 32a together address a memory cell 14a (cell 1).

Individual units of the control circuitry 44 are each shown to comprise a routing structure 54, and two switches (transistors) 50 and 52, with two of the units being labeled 44a and 44b. The transistors 50 and 52 are adjacent to one another, and may be referred to as first and second transistors, respectively.

Figure 3B:
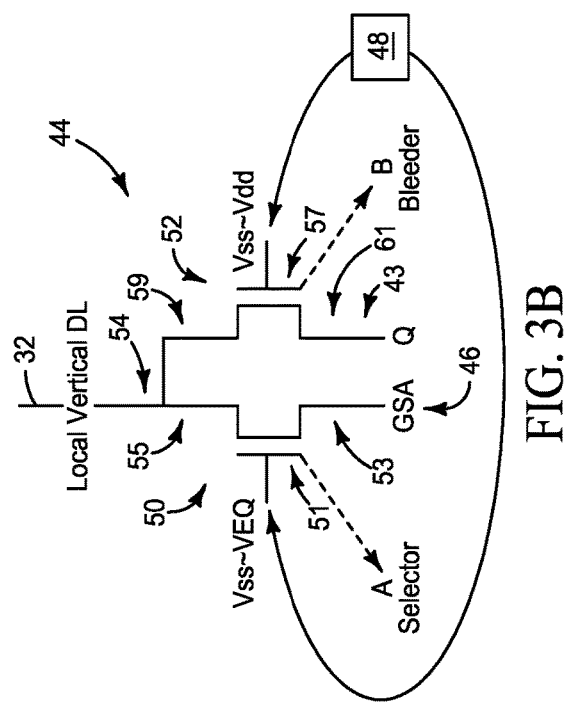
FIG. 3B is a diagrammatic schematic view of an example Mux configuration.
Figures 1, 3B:
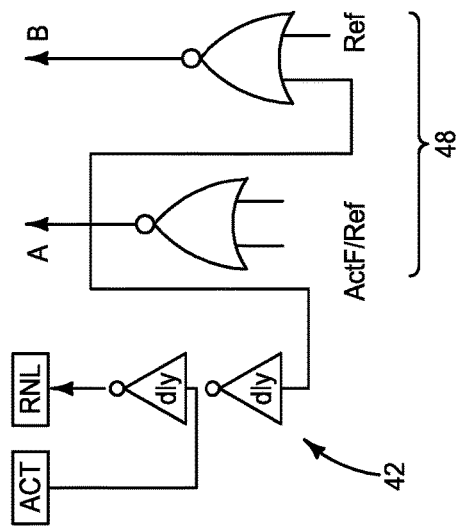

FIG. 3B shows one of the control circuitries 44 in more detail. The first transistors 50 have first gates 51, and have first and second source/drain regions 53 and 55; and the second transistors 52 have second gates 57, and have third and fourth source/drain regions 59 and 61. The first gates 51 gatedly couple the first and second source/drain regions 53 and 55 with one another, and the second gates 57 gatedly couple the third and fourth source/drain regions 59 and 61 with one another.

The first transistor gates 51 may comprise a deactivation voltage of about VSS (Vss), and an activation voltage of about VEQ; and the second transistor gates 57 may comprise a deactivation voltage of about VSS and an activation voltage of about VDD (Vdd). The voltage VDD may be about the same as the voltage VCC. The voltage VEQ may be greater than the voltage VDD, and accordingly the first transistor 51 may have a higher threshold voltage than the second transistor 57. In other embodiments, the first and second transistors 51 and 57 may have substantially the same threshold voltage as one another, and may be activated with substantially the same activation voltage as one another; where the term "substantially the same" means the same to within reasonable tolerances of fabrication and measurement. An advantage of having a higher threshold voltage associated with the transistor 51 is that such may be suitable for transferring high voltage signals from the digit lines 32 to the GSA circuitry 46. In contrast, the lower threshold voltage transistors 57 may be suitable for the PRECHARGE/REFRESH operations associated the digit lines 32.

The routing structures 54 are coupled with the second and third source/drain regions 55 and 59, and extend from the second/third source/drain regions to the digit lines 32.

The first source/drain regions 53 are coupled with the second sense-amplifier-circuitry 46 (the GSA circuitry), and the fourth source/drain regions 61 are coupled with the voltage supply terminals 43. The voltage supply terminals 43 are coupled with a voltage source at the voltage level Q (e.g., VCC/2).

The first and second gates 51 and 57 are coupled with the control unit 48. In some embodiments, the control circuitry 44 may be referred to as Mux (multiplexer) circuitry (or as Mux components), and the control unit 48 may be referred to as Mux-Driver-circuitry. The Mux-Driver-circuitry 48 is configured to selectively activate/deactivate one or both of the first and second gates 51 and 57 during programming operations (e.g., during PRECHARGE operations, REFRESH operations, READ operations, WRITE operations, etc.). In the illustrated embodiments of FIGS. 2 and 3, the Mux components 44 are in one-to-one correspondence with the digit lines 32.

The embodiment of FIG. 3B refers to the first gate 51 as being associated with a Selector (A), and refers to the second gate 57 as being associated with a Bleeder (B). The terms Selector and Bleeder are utilized to convey example operational aspects of the gates 51 and 57, with the gate 51 being utilized to "select" the GSA circuitry 46, and the gate 57 being utilized to "bleed" the voltage level Q into the digit lines 32 during PRECHARGE operations.

FIG. 3B-1 diagrammatically illustrates example control circuitry that may be associated with the Mux-Driver-circuitry 48 and with the LSAs 42.

Figure 3A:
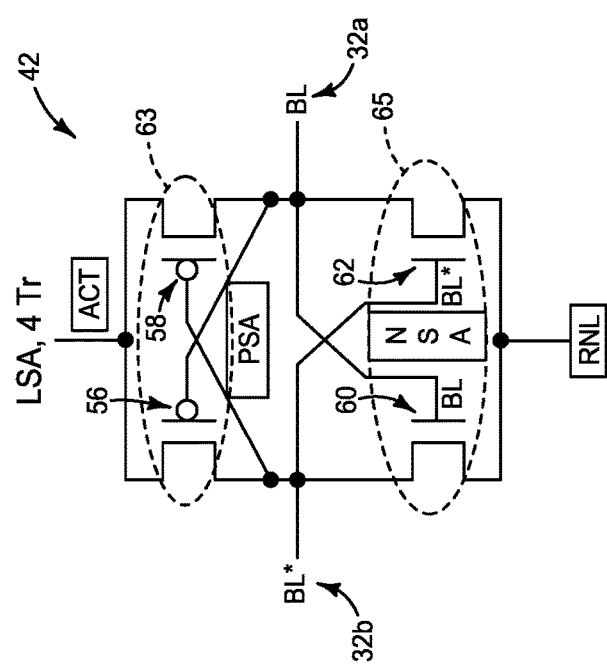
FIG. 3A is a diagrammatic schematic view of an example layout of an example sense amplifier configuration.

FIG. 3A diagrammatically illustrates an example LSA 42. The LSA comprises a pair of cross-coupled PMOS transistors (pull-up transistors) 56 and 58, and comprises a pair of cross-coupled NMOS transistors (pulldown transistors) 60 and 62. The PMOS transistors 56 and 58 may be considered together as a PSA region 63 (pull-up region), and the NMOS transistors 60 and 62 may be considered together as an NSA region 65 (pulldown region). Signals from a pair of comparatively coupled bitlines (BL and BL*, which correspond to the digit lines 32a and 32b, respectively) are shown to be associated with the LSA 42. One of the signals will be higher than the other. The LSA 42 is configured to drop the lower signal to a full discharge level, and to lift the higher signal to a full charge level. The symbols ACT and RNL refer to voltage levels, as will be understood by person of ordinary skill.

The NMOS and PMOS transistors of the LSA 42 may be within CMOS supported by the base 12.

The LSA 42 of FIG. 3 is a simple device that utilizes only four transistors (Tr). Such device may be readily incorporated into applications of the type described above with reference to FIGS. 2 and 3 in which the device is provided directly under adjacent digit lines. The LSA devices may be kept relatively small, especially as compared to GSA devices (with example GSA devices being described below).

Referring again to FIG. 3, the assembly 200 is shown at an operational stage during a REFRESH operation associated with the digit line 32a. The first and second transistors 50 and 52 within the Mux components 44a and 44b are deactivated (i.e., the gate voltages to such transistors is Vss), and accordingly the digit lines 32a and 32b are comparatively coupled one another through the LSA 42a. Notably, the other digit lines are maintained in a PRECHARGE state, and specifically the second transistors 52 associated with such digit lines are activated (i.e., the gate voltages are Vdd) so that the digit lines are coupled with the PRECHARGE voltage Q.

FIG. 4 shows an example READ operation utilizing the GSA 46. The first transistors 50 of the Mux components 44a and 44b are activated (i.e., the gate voltages to such transistors is VEQ), and the second transistors 52 of the Mux components 44a and 44b are deactivated (i.e., the gate voltages to such transistors is Vss), and accordingly the digit lines 32a and 32b are comparatively coupled through the GSA 46. The activated wordline 34a (LWL) and the digit line 32a together address the memory cell 14a (cell 1), and the content of such cell is accessed during the READ operation of FIG. 4.

The signals from the digit lines 32a and 32b are passed to column-select-circuitry 64 and 66, and from the column-select-circuitry to the GSA circuitry 46. FIG. 4A diagrammatically illustrates an example GSA configuration 46. The configuration includes local input/output signals (LIO) that pass to the column-select-circuitry 64 and 66, as will be understood by persons of ordinary skill. The column-select-circuitry 64/66 is utilized for addressing the selected digit lines 32a and 32b, with such digit lines being referenced as BL and BL*in FIG. 4A.

The GSA configuration of FIG. 4A comprises 12 transistors, and accordingly is much larger than the LSA configurations of FIG. 3A. The GSA configuration of FIG. 4A comprises a pair of cross-coupled PMOS transistors (pull-up transistors) 72 and 74, and comprises a pair of cross-coupled NMOS transistors (pulldown transistors) 76 and 78. The column-select-circuitry 64/66 comprises a first transistor 71a laterally offset from a first side 73a of a region comprising the pull-up and pulldown transistors, and comprises a second transistor 71b laterally offset from a second side 73b of the region comprising the pull-up and pulldown transistors, with the second side being in opposing relation to the first side.

In some embodiments, the GSA configuration of FIG. 4A may have a higher threshold voltage associated therewith than does the LSA configuration of FIG. 3A. The threshold voltage associated a sense amplifier may be understood to be related to the threshold voltages associated with the transistors (e.g., the PMOS transistors and NMOS transistors) of the sense amplifier. It may be advantageous for the GSA to have a higher threshold voltage than the LSAs as it may be desirable to configure the GSA and LSAs to be suitable for handling (and generating) different load levels (i.e., different levels of signal strengths).

The NMOS and PMOS transistors of the GSA configuration of FIG. 4A may be within CMOS supported by the base 12. In some embodiments, the CMOS circuitry of the GSA configuration of FIG. 4A may be referred to as second CMOS circuitry to distinguish it from the first CMOS circuitry of the LSA configuration of FIG. 3A.

The embodiment of FIG. 4 shows the GSA 46 to be associated with numerous of the LSAs 42. The illustrated embodiment shows three of the LSAs 42 to be associated with the GSA 46, but indicates that there may be more than three of the LSAs associated with the GSA. In some embodiments, there may be at least about 10 of the local sense amplifiers (LSAs 42) associated a single global sense amplifier (GSA 46), at least about 100 of the local sense amplifiers associated with the single global sense amplifier, at least about 500 of the local sense amplifiers associated the single global sense amplifier, etc.

The view of FIG. 4 may be considered to illustrate a slice through a three-dimensional configuration comprising the three-dimensional array 16 of the memory cells 14. There may be a large number of such slices (e.g., at least about 10 of such slices, at least about 50 such slices, at least about 100 of such slices, etc.), and each of the slices may comprise a global sense amplifier 46 associated with a large number of local sense amplifiers. Accordingly, in some embodiments there may be at least about 10 global sense amplifiers, at least about 50 global sense amplifiers, at least about 100 global sense amplifiers, etc., associated a three-dimensional memory array.

The sense amplifier assembly of FIG. 4A may be equilibrated with any suitable equilibration configuration. FIG. 4A-1 shows an example configuration 67 which utilizes a pair transistors 68 and 69, and a control unit 70 (Equalizer) configured for controlling activation/deactivation of the transistors 68 and 69. Voltage levels Q, R and S are shown at source/drain regions of the transistors. The voltage level Q may be the PRECHARGE level described above, and the levels R and S may be any suitable levels, as will be understood by persons of ordinary skill.

The configuration of FIG. 4 is described as utilizing the GSA 46 for the READ operation. In other embodiments, the GSA 46 may be utilized in combination with an LSA 42 during a READ operation. For instance, FIG. 5 shows the assembly 200 at a process stage similar to that of FIG. 4, but in which the LSA 42a is utilized for the read operation in addition to the GSA 46. The configuration of FIG. 5 is similar to that of FIG. 4, but the boundaries of the LSA regions of FIG. 5 are shown with solid lines and those of FIG. 4 are shown with dashed lines to diagrammatically indicate a difference in usage of the LSA regions. Differences between the embodiment of FIG. 5 and that of FIG. 4 may be further understood with reference to FIGS. 5A and 5A-1. Specific, FIG. 5A shows that the GSA configuration may now be an eight transistor configuration rather than the 12 transistor configuration of FIG. 4A. FIG. 5A-1 shows that a circuit comparable to the equalizer circuit of FIG. 4A-1 now utilizes signals (voltages) from the bitlines 32a and 32b.

FIG. 6 graphically shows relative signal strength versus time for various structures associated with the assembly 200 of FIG. 5 during a READ operation. At an early stage 80 of the READ operation, the difference in signal strength between the bitlines 32a and 32b is illustrated to be an amount 51. In some embodiments, S1 may be less than or equal to about 200 mV (millivolts). At a subsequent stage 82, the difference in signal strength between the bitlines 32a and 32b is boosted utilizing the LSA circuitry 42. There may be a minor loss in the difference in signal strength between the bitlines 32a and 32b during a stage 84 as the signals of the digit lines are transferred from the LSA circuitry 42 to the GSA circuitry 46, and then a stage 86 is entered whereupon the GSA circuitry 46 is utilized to substantially boost the difference in signal strength between the digit lines 32a and 32b.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a memory array over a base. The memory array has a three-dimensional arrangement of memory cells. First sense-amplifier-circuitry is associated with the base and includes sense amplifiers directly under the memory array. Vertically-extending digit lines pass through the arrangement of the memory cells and are coupled with the first sense-amplifier-circuitry. Second sense-amplifier-circuitry is associated with the base and is offset from the first sense-amplifier-circuitry. Control circuitry is configured to selectively couple the digit lines to either a voltage supply terminal or to the second sense-amplifier-circuitry.

Some embodiments include an integrated assembly comprising a memory array over a base. First sense-amplifier-circuitry is associated with the base and comprises sense amplifiers directly under the memory array. Vertically-extending digit lines are associated with the memory array and are coupled with the first sense-amplifier-circuitry. Second sense-amplifier-circuitry is offset from the first sense-amplifier-circuitry. The first sense-amplifier-circuitry is configured to be utilized in PRECHARGE operations. The second sense-amplifier-circuitry is configured to be utilized in READ/WRITE operations but not in the PRECHARGE operations.

Some embodiments include an integrated assembly comprising a memory array over a base. Vertically-extending digit lines are associated with the memory array. Sense amplifiers are under the memory array and are coupled with the digit lines. Routing structures are coupled to each of the digit lines and extend to Mux components. The Mux components are in one-to-one correspondence with the digit lines. Each of the Mux components comprises a first transistor and a second transistor. The first transistors have first gates, first source/drain regions and second source/drain regions. The first gates gatedly couple the first and second source/drain regions with one another. The second transistors have second gates, third source/drain regions and fourth source/drain regions. The second gates gatedly couple the third and fourth source/drain regions with one another. The routing structures are coupled with the second and third source/drain regions. The first source/drain regions are coupled with second sense-amplifier-circuitry. The fourth source/drain regions are coupled with a voltage source. The first and second gates are coupled with Mux-Driver-circuitry configured to selectively activate/deactivate the first and second gates.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein the control circuitry comprises a first transistor and a second transistor, the first transistor having a different threshold voltage than the second transistor.

2. The integrated assembly of claim 1 wherein the second sense-amplifier-circuitry is not directly under the memory array.

3. The integrated assembly of claim 1 wherein the voltage supply terminal is at a voltage of about VCC/2.

4. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein:
the sense amplifiers are first sense amplifiers;
the second sense-amplifier-circuitry comprises second sense amplifiers;
the first sense amplifiers are in configurations having no more 4 transistors; and
the second sense amplifiers are in configurations having at least 8 transistors.

5. The integrated assembly of claim 4 wherein the second sense amplifiers are in configurations having at least 12 transistors.

6. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein:
the first sense-amplifier-circuitry comprises a first threshold voltage;
the second sense-amplifier-circuitry comprises a second threshold voltage; and
the second threshold voltage is greater than the first threshold voltage.

7. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein the three-dimensional arrangement includes at least about 8 vertically-stacked tiers of the memory cells.

8. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein the three-dimensional arrangement includes at least about 16 vertically-stacked tiers of the memory cells.

9. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;

second sense-amplifier-circuitry supported by the base and offset from the first sense-amplifier-circuitry;
control circuitry configured to selectively couple the digit lines to either a voltage supply terminal or to the second sense-amplifier-circuitry; and
wherein the three-dimensional arrangement includes at least about 64 vertically-stacked tiers of the memory cells.

10. An integrated assembly, comprising:
a memory array over a base;
first sense-amplifier-circuitry supported by the base and comprising sense amplifiers directly under the memory array;
vertically-extending digit lines passing through the memory array and being coupled with the first sense-amplifier-circuitry;
second sense-amplifier-circuitry offset from the first sense-amplifier-circuitry;
the first sense-amplifier-circuitry being configured to be utilized in PRECHARGE operations;
the second sense-amplifier-circuitry being configured to be utilized in READ/WRITE operations but not in the PRECHARGE operations; and
wherein the first sense-amplifier-circuitry comprises a first transistor and the second sense-amplifier-circuitry comprises a second transistor, the first transistor having a different threshold voltage than the second transistor.

11. The integrated assembly of claim 10 comprising control circuitry laterally offset from digit lines and being configured to selectively couple the digit lines to either a voltage supply terminal or to the second sense-amplifier-circuitry.

12. The integrated assembly of claim 10 wherein the first sense-amplifier-circuitry is configured to be utilized in the READ/WRITE operations to boost a signal prior to sending the signal to the second sense-amplifier-circuitry.

13. The integrated assembly of claim 10 wherein the sense amplifiers are first sense amplifiers supported by the base and comprising first CMOS circuitry, and wherein the second sense-amplifier-circuitry comprises second sense amplifiers supported by the base and comprising second CMOS circuitry.

14. An integrated assembly, comprising:
a memory array over a base;
first sense-amplifier-circuitry supported by the base and comprising sense amplifiers directly under the memory array;
vertically-extending digit lines passing through the memory array and being coupled with the first sense-amplifier-circuitry;
second sense-amplifier-circuitry offset from the first sense-amplifier-circuitry;
the first sense-amplifier-circuitry being configured to be utilized in PRECHARGE operations;
the second sense-amplifier-circuitry being configured to be utilized in READ/WRITE operations but not in the PRECHARGE operations; and
wherein:
the first sense-amplifier-circuitry comprises a first threshold voltage;
the second sense-amplifier-circuitry comprises a second threshold voltage; and
the second threshold voltage is greater than the first threshold voltage.

15. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein the control circuitry comprises a first transistor having a first gate and a second transistor having a second gate, the first gate utilizes an activation voltage different from an activation voltage utilized by the second gate.

16. An integrated assembly, comprising:
a memory array over a base; the memory array comprising a three-dimensional arrangement of memory cells;
first sense-amplifier-circuitry supported by the base and comprising sense amplifiers directly under the memory array;
vertically-extending digit lines passing through the arrangement of the memory cells and being coupled with the first sense-amplifier-circuitry;
second sense-amplifier-circuitry supported by the base and offset from the first sense-amplifier-circuitry;
control circuitry configured to selectively couple the digit lines to either a voltage supply terminal or to the second sense-amplifier-circuitry; and
wherein:
the first sense-amplifier-circuitry comprises a first threshold voltage;
the second sense-amplifier-circuitry comprises a second threshold voltage; and
the second threshold voltage is different from the first threshold voltage.

17. An integrated assembly, comprising:
a memory array over a base;
first sense-amplifier-circuitry supported by the base and comprising sense amplifiers directly under the memory array;
vertically-extending digit lines passing through the memory array and being coupled with the first sense-amplifier-circuitry;
second sense-amplifier-circuitry offset from the first sense-amplifier-circuitry;
the first sense-amplifier-circuitry being configured to be utilized in PRECHARGE operations;
the second sense-amplifier-circuitry being configured to be utilized in READ/WRITE operations but not in the PRECHARGE operations; and
wherein the first sense-amplifier-circuitry comprises a first transistor having a first gate and the second sense-amplifier-circuitry comprises a second transistor having a second gate, the first gate utilizes an activation voltage different from an activation voltage utilized by the second gate.

18. An integrated assembly, comprising:
a memory array over a base;
first sense-amplifier-circuitry supported by the base and comprising sense amplifiers directly under the memory array;
vertically-extending digit lines passing through the memory array and being coupled with the first sense-amplifier-circuitry;

second sense-amplifier-circuitry offset from the first sense-amplifier-circuitry;
the first sense-amplifier-circuitry being configured to be utilized in PRECHARGE operations;
the second sense-amplifier-circuitry being configured to be utilized in READ/WRITE operations but not in the PRECHARGE operations; and
wherein:
   the first sense-amplifier-circuitry comprises a first threshold voltage;
   the second sense-amplifier-circuitry comprises a second threshold voltage; and
   the second threshold voltage is greater than the first threshold voltage.

\* \* \* \* \*